(12) United States Patent
Anazawa et al.

(10) Patent No.: US 10,328,419 B2
(45) Date of Patent: Jun. 25, 2019

(54) METHOD FOR PRODUCING A PHOTOEXCITATION MATERIAL (71) Applicant: FUJITSU LIMITED, Kawasaki-shi, Kanagawa (JP)

(72) Inventors: Toshihisa Anazawa, Sagamihara (JP); Yoshihiko Imanaka, Atsugi (JP); Toshio Manabe, Atsugi (JP); Hideyuki Amada, Atsugi (JP); Sachio Ido, Yamato (JP); Fumiaki Kumasaka, Atsugi (JP); Naoki Awaji, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/006,939

(22) Filed: Jun. 13, 2018

(65) Prior Publication Data

US 2018/0290130 A1    Oct. 11, 2018

Related U.S. Application Data

(62) Division of application No. 15/581,896, filed on Apr. 28, 2017, now Pat. No. 10,016,746.

(30) Foreign Application Priority Data

May 31, 2016    (JP) .................. 2016-108751

(51) Int. Cl.
*B01J 35/00* (2006.01)
*B01J 27/24* (2006.01)
*H01L 31/0328* (2006.01)
*H01L 31/18* (2006.01)
*B01J 37/02* (2006.01)
*H01L 31/032* (2006.01)
*H01L 31/0296* (2006.01)
*H01L 31/0304* (2006.01)

(52) U.S. Cl.
CPC ............. *B01J 27/24* (2013.01); *B01J 35/004* (2013.01); *B01J 35/0033* (2013.01); *B01J 37/0238* (2013.01); *H01L 31/032* (2013.01); *H01L 31/0328* (2013.01); *H01L 31/1828* (2013.01); *H01L 31/1856* (2013.01); *H01L 31/0296* (2013.01); *H01L 31/03044* (2013.01)

(58) Field of Classification Search
CPC ... H01L 31/00; H01L 31/032; H01L 31/1828; H01L 31/0296; B01J 35/0033
USPC ........................................................ 502/439
See application file for complete search history.

(56) References Cited

U.S. PATENT DOCUMENTS 10,016,746 B2 *  7/2018  Anazawa ................. B01J 27/24

FOREIGN PATENT DOCUMENTS

| JP | 2001-322814 A | 11/2001 |
| JP | 2006-104042 A | 4/2006 |
| JP | 2006-116415 A | 5/2006 |

OTHER PUBLICATIONS

USPTO, (Edward) Restriction Requirement, dated Dec. 21, 2017 in parent U.S. Appl. No. 15/581,896 [pending ].
USPTO, (Edward) Notice of Allowance and Notice of Allowability, dated Mar. 14, 2018, in parent U.S. Appl. No. 15/581,896 [pending].

* cited by examiner

*Primary Examiner* — Edward M Johnson
(74) *Attorney, Agent, or Firm* — Fujitsu Patent Center (57) ABSTRACT

A photoexcitation material includes: a wurtzite type solid solution crystal containing t gallium, zinc, nitrogen and oxygen, wherein a peak (A) of an existence ratio of nitrogen or oxygen which is a first adjacent atom of the gallium or zinc and a peak (B) of an existence ratio of gallium or zinc which is a second adjacent atom of the gallium or zinc satisfy a relational expression of A>B in a relationship between a distance and the existence ratio of the adjacent atom of the gallium or zinc, the relationship being obtained from an extended X-ray absorption fine structure analysis.

5 Claims, 8 Drawing Sheets

METHOD FOR PRODUCING A PHOTOEXCITATION MATERIAL

CROSS-REFERENCE TO RELATED APPLICATION

This application is a divisional of application Ser. No 15/581,896, filed Apr. 28, 2017, which is based upon and claims the benefit of priority of the prior Japanese Patent Application No. 2016-408751, filed on May 31, 2016, the entire contents of which are incorporated herein by reference.

FIELD

The embodiments discussed herein are related to a phot excitation material and a method for producing the photoexcitation material.

BACKGROUND

Technologies utilizing solar energy include an artificial photosynthesis technology, a photocatalytic technology and the like.

Related technologies are disclosed in, for example, Japanese Open Patent Publication No. 2006-116415.

SUMMARY

According to one aspect of the embodiments, a photoexcitation material includes: a wurtzite type solid solution crystal containing gallium, zinc, nitrogen and oxygen, wherein a peak (A) of an existence ratio of nitrogen or oxygen which is a first adjacent atom of the gallium or zinc and a peak (B) of an existence ratio of gallium or zinc which is a second adjacent atom of the gallium or zinc satisfy a relational expression of A>B in a relationship between a distance and the existence ratio of the adjacent atom of the gallium or zinc, the relationship being obtained from an extended X-ray absorption fine structure analysis The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In an artificial photosynthetic technology, a hydrogen gas is produced from water and an organic matter is synthesized from water and carbon dioxide. In the photocatalytic technology mentioned earlier for example, contaminants are decomposed. For example, photo excitation materials are used for these technologies.

A photoexcitation material is a semiconductor haying a forbidden band between a valence band and a conduction band. In the photoexcitation material, electrons in the valence band are excited into the conduction band by absorbing the sunlight, and as a result, holes are generated in the valence band. The generated excited electrons or holes reduce or oxidize water or contaminants. In order to increase the utilization of solar energy a photo excitation material may be provided which absorbs a solar spectrum from a short wavelength to a long wavelength as long as possible. In order to provide such a photoexcitation material, an energy width of the forbidden band may be narrow.

Gallium nitride (GaN) and zinc oxide (ZnO) are ultraviolet light responsive photoexcitation materials having forbidden bandwidths of about 3.1 eV and about 3.2 eV, respectively. Each of GaN and ZnO has a wurtzite type crystal structure. When GaIl and ZnO are mixed in a certain ratio, a $Ga_xN_xZn_{1-x}O_{1-x}$ solid solution having the same crystal structure is formed.

In the $Ga_xN_xZn_{1-x}O_{1-x}$ solid solution, a forbidden bandwidth is narrower than that of pure GaN and ZnO. This is because a (N 2p)-(Zn 45, 4p) bond is newly generated in the vicinity of the top of the valence band in the $Ga_xN_xZn_{1-x}O_{1-x}$ solid solution. The narrowness of the forbidden bandwidth brings about high efficiency of light energy use. For example, making gallium nitride (GaN) and zinc oxide (ZnO) solid solution simply may have a limitation in narrowness of the forbidden bandwidth. For example, a photoexcitation material having a narrow forbidden bandwidth that may utilize light energy with high efficiency may be provided.

The photoexcitation material contains gallium, zinc, nitrogen and oxygen. The photoexcitation material has a wurtzite type solid solution crystal. In the photoexcitation material, a peak (A) of the existence ratio of nitrogen or oxygen which is a first adjacent atom of gallium or zinc and a peak (B) of the existence ratio of gallium or zinc which is a second adjacent atom of gallium or zinc satisfy the following equation (1) in a relationship between a distance and the existence ratio of an adjacent atom of gallium or zinc in the photoexcitation material, which is obtained from an extended X-ray absorption fine structure analysis.

$$A > B \qquad (1)$$

The photoexcitation material may be represented by the following formula (1).

In the formula (1), x may fall within a range 0.00<x<1.00, particularly, 0.25≤x≤0.75.

In the photoexcitation material, the bandgap energy may be 2.5 eV or less, and may be, for example, 2.2 eV or less. The lower limit value of the band gap energy is not particularly limited but may be appropriately selected depending on the intended purpose. For example, the band gap energy may be 2.0 eV or more.

The photoexcitation material is a material that absorbs light in such a manner that electrons are excited.

In the $Ga_xN_xZn_{1-x}O_{1-x}$ solid solution, the forbidden bandwidth is the narrowest when x is about 0.5. The forbidden bandwidth (band gap energy) at this time is about 2.5 eV. The narrowest forbidden bandwidth that has been obtained so far in $Ga_xN_xZn_{1-x}O_{1-x}$ is about 2.5 eV when x is 0.5, but the radiation with photon energy of 2.5 eV or more in the solar spectrum is only about 20% of the total energy radiation. Therefore, by further narrowing the forbidden bandwidth of $Ga_xN_xZn_{1-x}O_{1-x}$, the utilization efficiency of sunlight may be improved.

For example, by reducing the distance between metal ions ($Ga^{3+}$—$Ga^{3+}$, $Zn^{2+}$—$Zn^{2+}$, $Ga^{3+}$—$Zn^{2+}$) constituting a $Ga_xN_xZn_{1-x}O_{1-x}$ crystal, the forbidden bandwidth of $Ga_xN_xZn_{1-x}O_{1-x}$ may be further narrowed.

In this case, the distance between a metal ion ($Ga^{3+}$ or $Zn^{2+}$) and an anion ($N^{3-}$ or $O^{2-}$) may not be reduced as much as possible. Therefore, a position of the metal ion may be shifted from a position defined by an ideal crystal structure. In that case, a distance between some metal ions is enlarged, but a distance between some other metal ions is reduced. In the $Ga_xN_xZn_{1-x}O_{1-x}$ solid solution, even if the position of the metal ion is shifted, a distance from anions surrounding the metal ion remains substantially constant and a tetrahedron constituted by the anions is distorted so that the positional shift of the metal ion is absorbed.

In order to shift the position of the metal ion in the $Ga_xN_xZn_{1-x}O_{1-x}$ solid solution, deposition on the substrate is carried out while adding distortion to the crystal powder. To that end, nano particle deposition (NPD) may be used.

Figure 1:
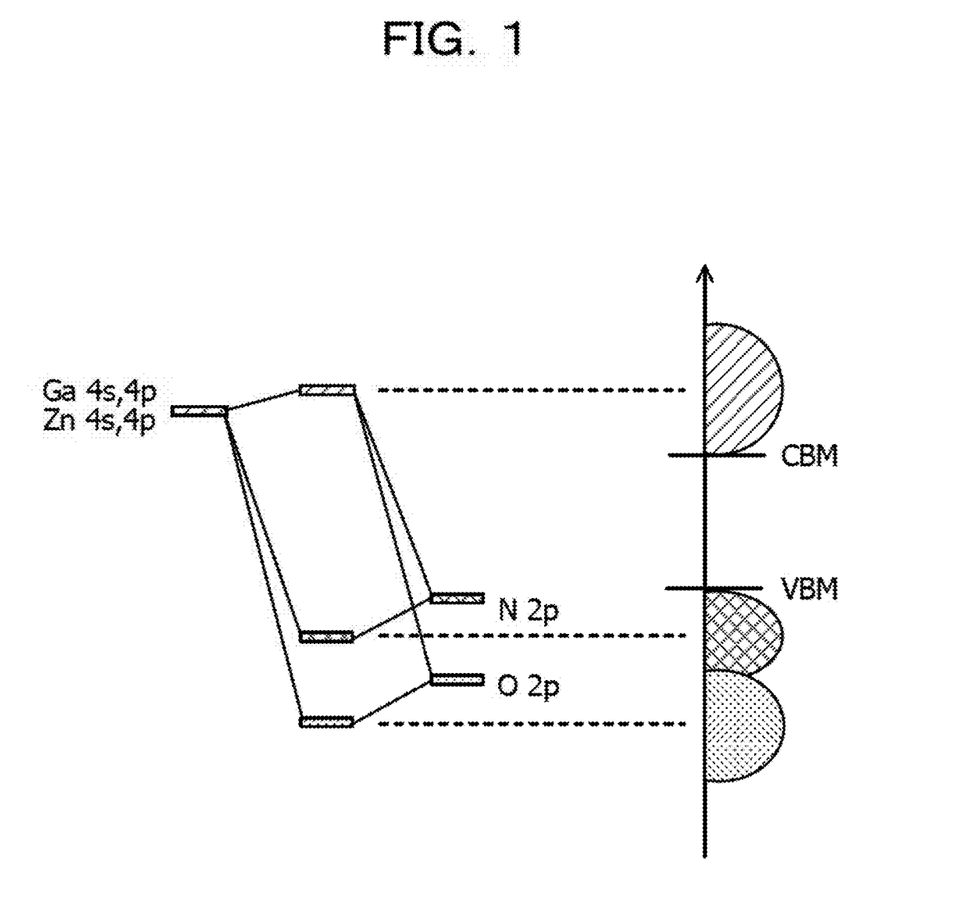
FIG. 1 illustrates an example of an electronic state of $Ga_xN_xZn_{1-x}O_{1-x}$.

FIG. 1 illustrates an example of an, electronic state of $Ga_xN_xZn_{1-x}O_{1-x}$. The 4s, 4p orbital of Ga or Zn combines with the 2p orbital of O or N to form a bond-antibond level. Since $Ga_xN_xZn_{1-x}O_{1-x}$ is strongly ionic, metal 4s and 4p electrons are ionized and mostly move to the 2p orbital of anion. A bond level having the property of anion 2p orbital is occupied by electrons and an antibond level having the property of metal 4s and 4p orbital is an empty level. The bond level constitutes a valence band and the antibond level constitutes a conduction band.

Figure 2:
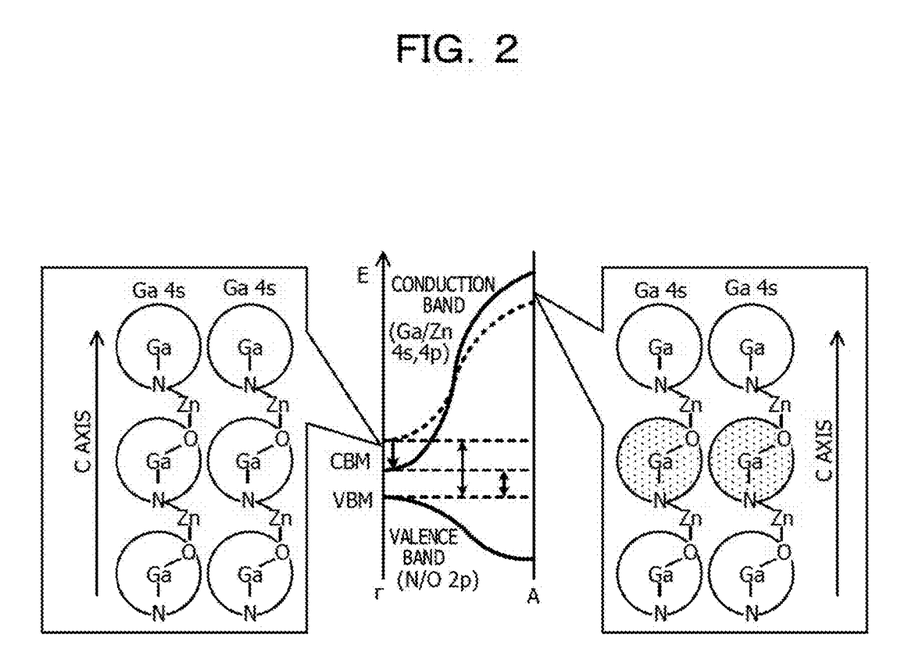
FIG. 2 illustrates an example of dispersion of a conduction band of $Ga_xN_xZn_{1-x}O_{1-x}$.

FIG. 2 illustrates an example of dispersion of a conduction band of $Ga_xN_xZn_{1-x}O_{1-x}$. As illustrated in FIG. 2, the conduction band indicates a bonding state in which the phase of a wave function consisting of an antibond level is uniform among crystal sites at the center (Γpoint) of the Brillouin zone, and has the lowest energy (conduction band bottom: CBM). At the edge of the Brillouin zone of the conduction band, wave functions are in opposite phases between sites and the energy is the highest in a case of giving an antibonding interaction between sites. A difference between the highest. energy and the lowest energy corresponds to a bandwidth. By bringing a distance between sites closer from an equilibrium distance, the interaction is strengthened to expand the bandwidth. When the bandwidth is expanded, a forbidden bandwidth is reduced reversely. As described above, the forbidden bandwidth is reduced by reducing the inter-site distance forming the conduction band, for example, the distance between metal ions.

In order to reduce all of inter-metal ion distances, the size of the entire crystal may be reduced. In this case, not only an inter-metal atom distance but also a metal ion-anion distance is reduced. When a metal ion-anion distance is shortened, since a separation width of the bond-antibond level illustrated in FIG. 1 is increased and the forbidden bandwidth is expanded reversely, only the inter-metal ion distance may be brought close to each other. As the positions of metal ions are shifted from the positions determined by the ideal crystal structure, some metal ions move away from each other, whereas some approach to each other. In this case, the conduction bandwidth becomes narrower and the forbidden bandwidth becomes wider in a portion where the distance is away, but since a conduction band widened in a portion where the distance is close exists in the entire crystal,. the forbidden bandwidth eventually becomes narrower.

The forbidden bandwidth of $Ga_xN_xZn_{1-x}O_{1-x}$ where the position of the metal ion is shifted from the position determined by the ideal crystal structure is obtained by an ab initio density functional theory (DFT) simulation. x is set to 0.5, at which the forbidden bandwidth becomes the narrowest, and a 32-atom supercell of $Ga_8Zn_8N_8O_8$ is used as a calculation model.

Figure 3:
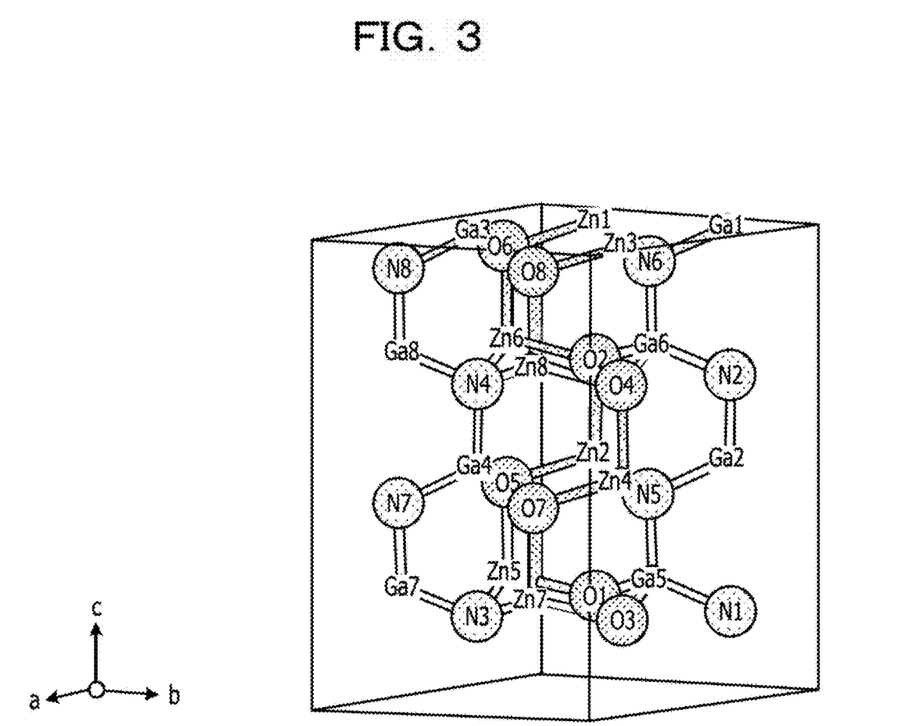
FIG. 3 illustrate an example of a $Ga_8Zn_8N_8O_8$ super cell.

A unit cell with a wurtzite type crystal structure is a rhombohedron containing two atoms in total which correspond two types of atoms (typically, cation and anion), respectively. A solid solution composed of a plurality of components, each of which contains cations or metal ions and anions, may be different from the crystal from the viewpoint of periodicity. For example, when cations and anions constituting the solid solution are considered to be the same, the above-described solid solution may be referred to as a wurtzite type crystal in a broad sense. Hereinafter, the term "wurtzite type crystal structure" may be used in this sense and the unit cell may also be referred to as a corresponding 2-atom (ion) cell. Since elements constituting each unit cell are different in each portion in the solid solution, two unit cells of the wurtzite type crystal structure are combined and the boundary of cells is shifted by an integer multiple of a lattice constant to form a 4-atom rhombic pillar cell. The 4-atom rhombic pillar cell is further doubled or multiplied by 8 in a-, b- and c-axial directions, respectively, to construct a 32-atom supercell. The arrangement of atoms of Ga N, Zn and O in the supercell may be a special quasi-random structure. The dimensions of the at axis and the c axis are set to values actually measured by X-ray diffraction (XRD) for $Ga_{0.5}N_{0.5}Zn_{0.5}O_{0.5}$. Thereafter, while maintaining a ratio of the a·b axis and the c axis, which is obtained by XRD, the size of the cell is optimized so that the total energy obtained by simulation becomes the smallest. The arrangement of atoms in the cell is relaxed so that a force acting between the atoms, which is obtained from the simulation, is sufficiently low. A structure of the supercell thus obtained is illustrated in FIG. 3. At this time, the forbidden bandwidth is 0.7 eV. This value is smaller than an experimental value (2.5 eV). For example, in the DFT simulation, the forbidden bandwidth may be calculated to be smaller than the experimental value. In the DFT simulation, although the absolute value may be varied, the tendency to increase/decrease in the forbidden bandwidth and the electronic structures of the valence band and the conduction band are reproduced by experimental results.

In the supercell illustrated in FIG. 3, the position of Ga or Zn is shifted. In the wurtzite type crystal structure, since each atom is relatively easily moved in the c-axial direction, the movement is set in the c-axial direction. When only the position of Ga or Zn is shifted in the c-axial direction, a distance of Ga or Zn to N or O directly bonded to Ga or Zn in the c-axial direction may be greatly changed. Therefore, the N or O is also moved by the same size in the same direction. In this case, speaking strictly, a distance between Ga or Zn and other three Ns or Os which are directly bonded to Ga or Zn but are not present in the c-axial direction is also changed. However, since a bond between Ga or Zn and N or O and the direction of movement of Ga or Zn form an angle of about 110°, the amount of change in the distance may be small.

Figure 4:
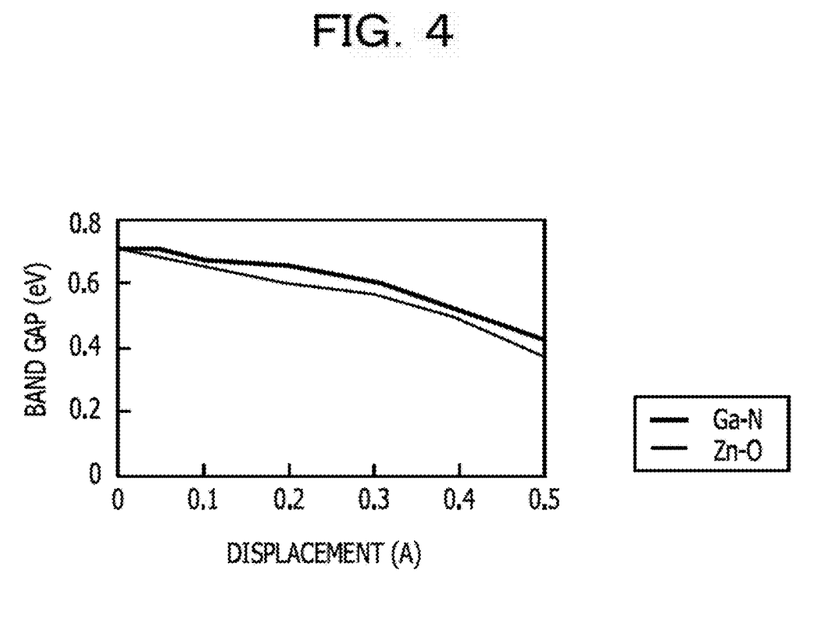
FIG. 4 illustrates an example of a relationship between a displacement amount and a forbidden bandwidth when positions of gallium/nitrogen and zinc/oxygen are displaced in a c-axial direction.

FIG. 4 illustrates an example of a relationship between a displacement amount and a forbidden bandwidth when positions of gallium/nitrogen and zinc/oxygen are displaced in the c-axial direction. In FIG. 4, the forbidden bandwidth is changed when the positions of (a) [Ga—N] and (b) [Zn—O] are changed in the c-axial direction in the supercell of FIG. 3. Although the magnitude of an effect varies depending on a moved atomic set ([Ga—N] or [Zn—O]) and the direction of movement (either positive or negative direction of the c axis), the forbidden bandwidth may be reduced in either case. In $Ga_{0.5}Zn_{0.5}N_{0.5}O_{0.5}$, the positions of metal atoms may be shifted from a position determined by a crystal structure, thereby creating a photoexcitation material with a smaller forbidden bandwidth.

A thin film is formed by nano particle deposition (NPD). In the NPD, a powder having a diameter of about micrometer is used as a raw material. The raw material is ejected from a nozzle, together with an inert carrier gas, in a vacuum and is deposited on a substrate. In the NPD, raw material powders collide with each other in the nozzle due to the high-speed flow of the carrier gas and are fractured to a nanometer size. The fractured surfaces of fractured pieces of the raw material powders are in a state of high surface energy with dangling bonds being exposed. The fractured pieces are blown onto the substrate to form a strong bond with the substrate or other particles through the dangling bonds. With the NPD, without using a binder, it is possible to form a film with a raw material of a complicated composition as it is and it may be possible to form a porous thin film depending on the conditions because the fractured pieces are deposited. Depending on the conditions, when the raw material powders collide strongly with each other or the fractured pieces strongly hit the substrate, local distortion may be introduced into crystal lattices.

Figure 5A:
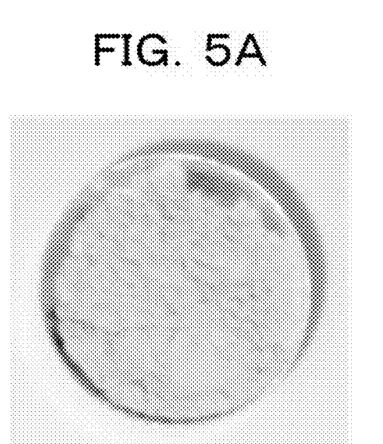
FIG. 5A illustrates an example of a photograph of a $Ga_{0.5}N_{0.5}Zn_{0.5}O_{0.5}$ powder.
Figure 5B:
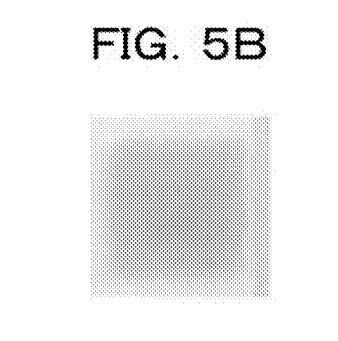
FIG. 5B illustrates an example of a photograph of a thin film obtained by NPD film formation of the $Ga_{0.5}N_{0.5}Zn_{0.5}O_{0.5}$ powder.
Figure 5C:
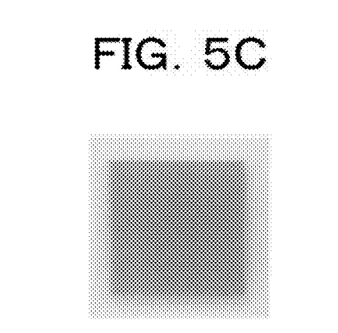
FIG. 5C illustrates an example of a photograph of a thin obtained by NPD film formation of the $Ga_{0.5}N_{0.5}Zn_{0.5}O_{0.5}$ powder.

FIG. 5A illustrates an example of a photograph of a $Ga_{0.5}N_{0.5}Zn_{0.5}O_{0.5}$ powder. Each of FIGS. 5B and 5C illustrates an example of a photograph of a thin film obtained by NPD film formation of the $Ga_{0.5}N_{0.5}Zn_{0.5}O_{0.5}$ powder. A forbidden bandwidth of $Ga_{0.5}N_{0.5}Zn_{0.5}O_{0.5}$ may be 2.5 eV and the raw material powder is in yellow (FIG. 5A), According to the measurement by XRD, a solid solution powder has a wurtzite type crystal structure. When NPD film formation is performed under a predetermined condition ($N_2$ carrier gas and flow rate 14 L/min, which are hereinafter referred to as a condition N) using this solid solution powder as a raw material, a yellow thin film similar to the raw material powder is obtained (FIG. 5B). For example, when the condition of NPD film formation is changed, for example, the carrier gas is changed to He (which is hereinafter referred to as a condition S), a brown thin film is obtained (FIG. 5C). This indicates that the forbidden bandwidth is reduced. The forbidden bandwidth of this sample measured by visible ultraviolet reflection absorption spectroscopy is 2.0 eV.

According to the measurement of XRD, the crystal structure of the brown thin film sample is a wurtzite type crystal structure, like the rake material yellow powder and its c axis is very slightly contracted as compared to that of the raw material yellow powder. For example, in the DFT simulation such a degree of contraction has little influence on a band structure.

Figure 6A:
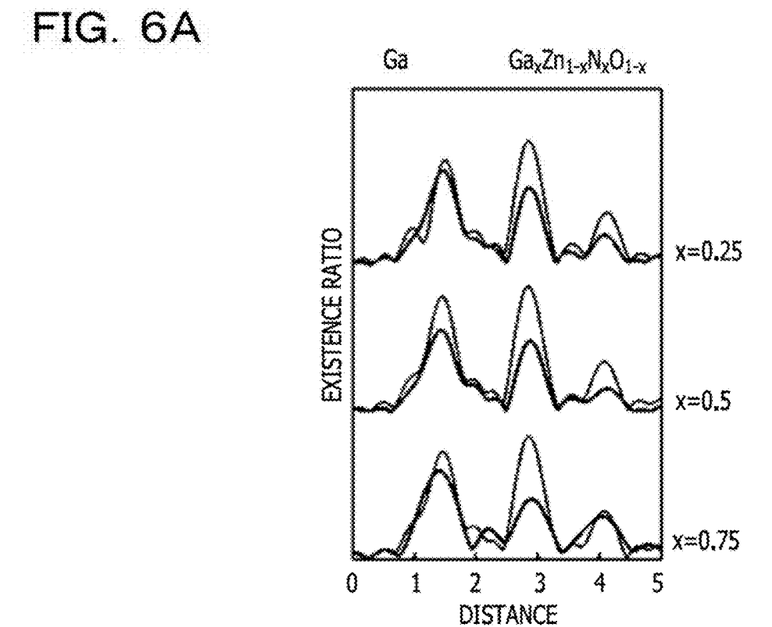
FIG. 6A illustrates an example of a relationship between an interatomic distance to an adjacent atom determined for Ga atoms by an extended X-ray absorption fine structure and a coordination number.
Figure 6B:
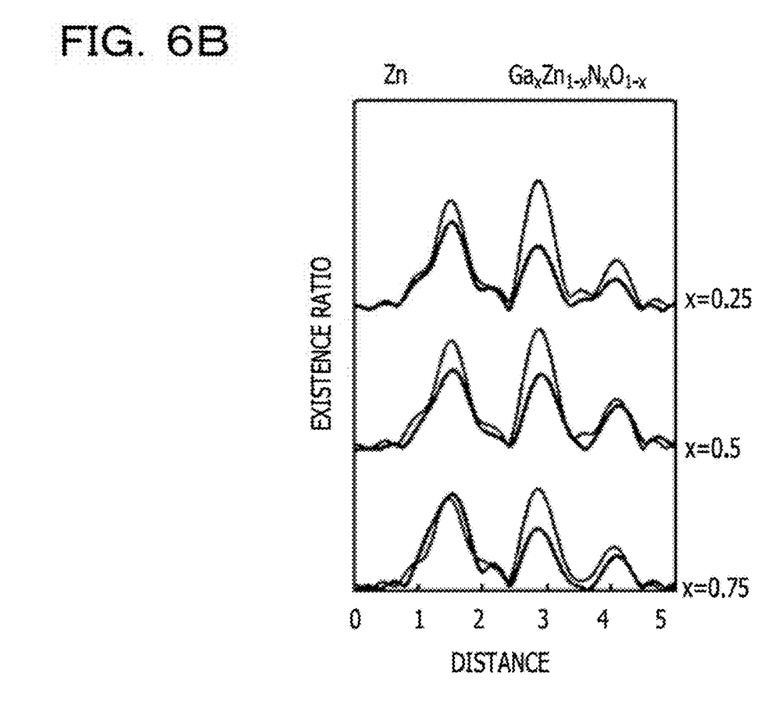
FIG. 6B illustrates an example of the relationship between an interatomic distance to an adjacent atom determined for Zn atoms by an, extended X-ray absorption fine structure and a coordination number.

FIG. 6A illustrates an example of a relationship between an interatomic distance to an adjacent atom and a coordination number, which is determined for Ga atoms by an extended X-ray absorption fine structure (EXAFS). FIGS. 6A and 6B illustrate a relationship between a coordination distance of an adjacent atom and a coordination number, which is determined for Ga atoms (FIG. 6A) or Zn atoms (FIG. 6B) by the EXAFS. In these figures, a thin line indicates a raw material yellow powder and a thick line indicates a brown NPD film. Three to four peaks are observed in both cases, but the peak of one point several Å corresponds to N or O which is closest to Ga or Zn and the peak of about 3 Å corresponds to the next closest Ga or Zn. When the raw material powder is NPD-deposited under the condition S, the closest N or O distance viewed from Ga or Zn and the peak intensity are not so much changed. However, it can be seen from the figures that the peak intensity of the next closest Ga or Zn viewed from Ga or Zn is reduced.

EXAFS refers to a phenomenon in which wavelength dependence occurs in absorption due to interference between photoelectrons emitted from an atom by an X-ray and photoelectrons scattered and returned at least once by other atoms in the surroundings. Therefore, a coordination number obtained by the analysis of EXAFS is only the distance to an atom coordinating to a certain fixed distance and the existence ratio of the atom, but a distribution of the distance to adjacent atoms existing at random and the existence ratio of the adjacent atoms may not be obtained. When the distance to the adjacent atoms is varied, the width of a peak is not widened but only the intensity of the peak is decreased. FIG. 6A illustrates that, in the thin film formed by NPD deposition under the condition S, O or N exists at the same distance as the raw material powder when viewed from Ga, whereas the distance between Ga and Ga or the distance between Ga and Zn is varied. The distance of O or N seen from Zn and the distance of Ga or Zn seen from Zn also illustrates the same tendency as that seen from Ga (FIG. 6B). This result illustrates that Ga or Zn is varied from a position determined by the crystal structure and, correspondingly, anions are, moved while keeping a bonding distance of metal-anion constant to some extent, and thus, a tetrahedron constituted by the anions is distorted or rotated.

Figure 7:
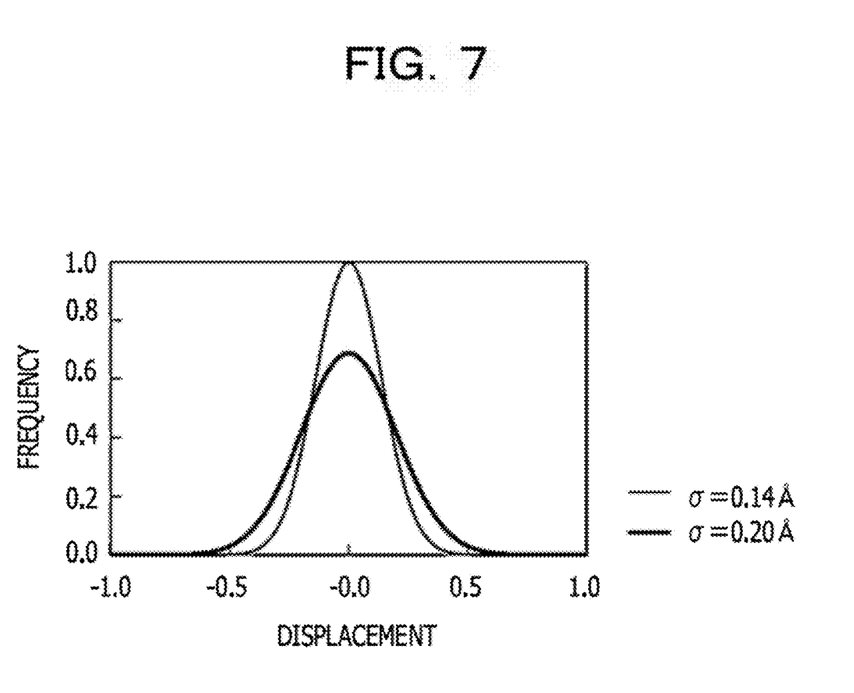
FIG. 7 illustrates an example of a variation in a peak intensity and an atomic position.

Both of the raw material powder and the NPD thin film formed under the condition S have a wurtzite type crystal structure and the total number of Ga or Zn surrounding Ga is the same. Assuming that the variation in a coordination distance takes a normal distribution, a distribution of Ga or Zn in the brown NPD thin film may be estimated from the change in peak intensity (the brown NPD film occupies 70% of the raw material powder) illustrated in FIGS. 6A and 6B. FIG. 7 illustrates an example of a variation in a peak intensity and an atomic position. FIG. 7 illustrates a Gaussian distribution (thin line) having the standard deviation ($\sigma=0.14$ Å) obtained from a radial distribution function in a stable structure by DFT calculation and a Gaussian distribution (thick line) having the standard deviation ($\sigma=0.20$ Å)

whose peak intensity is 70%. The integral areas of both Gaussian distributions may be substantially equal to each other. In the stable structure (thin line), the majority of atoms has a displacement of 0.2 Å or less where the band gap energy is not so much changed by DFT calculation. In the distribution (thick line) estimated from the results of EXAFS, more atoms are displaced by 0.2 Å or more. As disclosed above, a local strain is given to the crystal lattice by NPD film formation under specific conditions.

Figure 8:
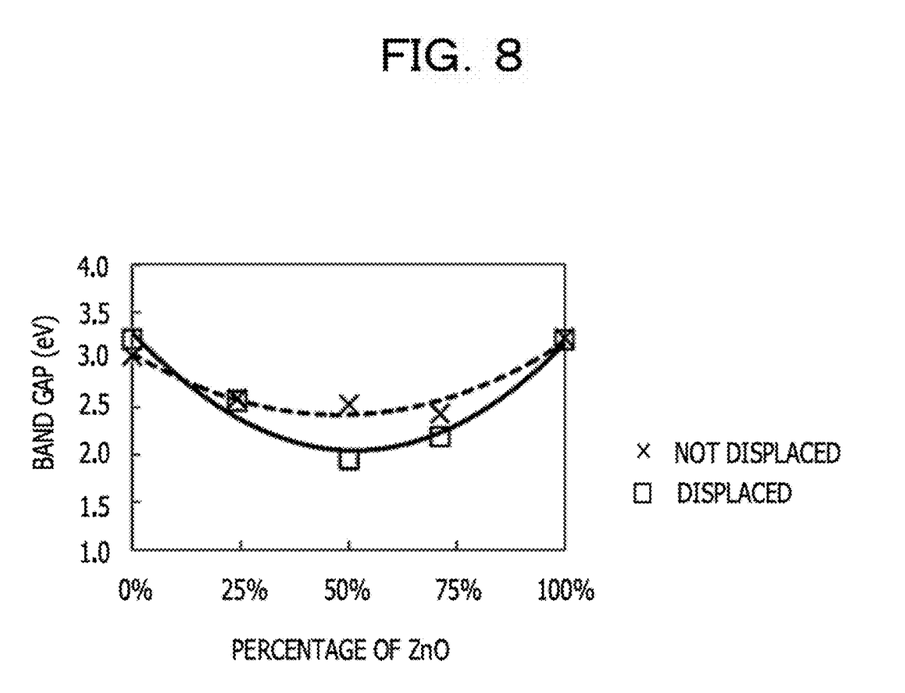
FIG. 8 illustrates a forbidden bandwidth of a thermodynamically stable powder and a forbidden bandwidth of a thin film, which is obtained by NPD film formation under a condition S, when x in a $Ga_xN_xZn_{1-x}O_{1-x}$ solid solution is changed.

FIG. 8 illustrates an example of a forbidden bandwidth. FIG. 8 illustrates a result of measurement, changing x in a $Ga_xN_{1-x}Zn_xO_{1-x}$ solid solution on a forbidden bandwidth of a raw material powder (indicated by a broken line) and a forbidden bandwidth of a thin film (indicated by a solid line) obtained by forming a NPD film under the condition S in the same manner as described above (x=0 represents ZnO and x=1 represents GaN). A raw material powder, which is the $Ga_xN_xZn_{1-x}O_{1-x}$ solid solution, is prepared by mixing $Ga_2O_3$ and ZnO so as to have a predetermined x with a ball mill and subsequently calcining the mixture in a flow of ammonia for 20 hours. The forbidden bandwidth of the NPD-deposited thin film is smaller in all compositions except for x=0 and x=1 which represent pure substances, but among them, the largest forbidden bandwidth reducing effect is obtained in a condition where x=0.5. At this time, the forbidden bandwidth is 2.0 eV and a photoexcitation material having the narrowest forbidden bandwidth among $Ga_xN_xZn_{1-x}O_{1-x}$ -based solid solutions is obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for producing a photoexcitation material, the method comprising:
   preparing a substrate; and
   depositing a powder of a material over the substrate using a He carrier gas according to a nano particle deposition method to form a thin film,
   wherein the thin film contains a wurtzite type solid solution crystal containing gallium, zinc, nitrogen and oxygen, and
   a peak (A) of an existence ratio of nitrogen or oxygen which is a first adjacent atom of the gallium or zinc and a peak (B) of an existence ratio of gallium or zinc which is a second adjacent atom of the gallium or zinc satisfy a relational expression of A>B in a relationship between a distance and the existence ratio of the adjacent atom of the gallium or zinc, the relationship being obtained from an extended X-ray absorption fine structure analysis.

2. The method according to claim 1, wherein the He carrier gas is ejected at a flow rate from a nozzle, together with the powder of the material, onto the substrate.

3. The method according to claim 1, wherein the thin film includes the photoexcitation material which is represented by $Ga_xN_xZn_{1.00-x}O_{1.00-x}$, where x falls within a range of 0.00<x<1.00.

4. The method according to claim 3, wherein x falls within a range of 0.25≤x≤0.75.

5. The method according to claim 4, wherein the photoexcitation material has band gap energy of 2.5 eV or less.

* * * * *